(12) United States Patent
Kim et al.

(10) Patent No.: US 11,145,808 B2
(45) Date of Patent: Oct. 12, 2021

(54) METHODS FOR ETCHING A STRUCTURE FOR MRAM APPLICATIONS

(71) Applicant: Applied Materials, Inc., Santa Clara, CA (US)

(72) Inventors: Jong Mun Kim, San Jose, CA (US); Minrui Yu, Sunnyvale, CA (US); Chando Park, Palo Alto, CA (US); Mang-Mang Ling, San Jose, CA (US); Jaesoo Ahn, San Jose, CA (US); Chentsau Chris Ying, Cupertino, CA (US); Srinivas D. Nemani, Sunnyvale, CA (US); Mahendra Pakala, Santa Clara, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 106 days.

(21) Appl. No.: 16/681,351

(22) Filed: Nov. 12, 2019

(65) Prior Publication Data

US 2021/0143323 A1    May 13, 2021

(51) Int. Cl.
*H01L 43/12* (2006.01)
*H01L 43/10* (2006.01)
*H01L 43/02* (2006.01)
*H01L 27/22* (2006.01)

(52) U.S. Cl.
CPC ............ *H01L 43/12* (2013.01); *H01L 27/222* (2013.01); *H01L 43/02* (2013.01); *H01L 43/10* (2013.01)

(58) Field of Classification Search
CPC ....... H01L 43/12; H01L 27/222; H01L 43/02; H01L 43/10

USPC .............................................. 438/3
See application file for complete search history.

(56) References Cited

U.S. PATENT DOCUMENTS

| | | | |
|---|---|---|---|
| 6,964,928 B2 | 11/2005 | Ying et al. | |
| 7,750,421 B2 | 7/2010 | Horng et al. | |
| 8,535,952 B2 * | 9/2013 | Ranjan | G11C 11/16 438/3 |
| 8,802,451 B2 * | 8/2014 | Malmhall | B82Y 10/00 438/3 |
| 9,028,910 B2 | 5/2015 | Zhou et al. | |
| 2004/0101978 A1 | 5/2004 | Linn et al. | |
| 2012/0135543 A1 * | 5/2012 | Shin | H01L 27/228 438/3 |
| 2013/0175644 A1 | 7/2013 | Horng et al. | |
| 2015/0255507 A1 | 9/2015 | Pakala et al. | |

(Continued)

OTHER PUBLICATIONS

International Search Report and Written Opinion for PCT/US2020/056989 dated Feb. 15, 2021.

*Primary Examiner* — Jami Valentine Miller
(74) *Attorney, Agent, or Firm* — Patterson + Sheridan, LLP

(57) ABSTRACT

Embodiments of the disclosure provide methods and apparatus for fabricating magnetic tunnel junction (MTJ) structures on a substrate for MRAM applications. In one embodiment, a method for forming a magnetic tunnel junction (MTJ) device structure includes performing a patterning process by an ion beam etching process in a processing chamber to pattern a film stack disposed on a substrate, wherein the film stack comprises a reference layer, a tunneling barrier layer and a free layer disposed on the tunneling barrier, and determining an end point for the patterning process.

19 Claims, 9 Drawing Sheets

(56) References Cited

U.S. PATENT DOCUMENTS

| | | | |
|---|---|---|---|
| 2016/0027999 A1* | 1/2016 | Pinarbasi | H01L 43/08 438/3 |
| 2016/0351799 A1 | 12/2016 | Xue et al. | |
| 2018/0069176 A1* | 3/2018 | Lee | H01L 27/222 |
| 2018/0358542 A1 | 12/2018 | Mihajlovic et al. | |
| 2019/0164586 A1 | 5/2019 | Chen et al. | |
| 2019/0221609 A1* | 7/2019 | Aggarwal | H01L 21/76877 |
| 2019/0304523 A1* | 10/2019 | O'Brien | G11C 11/161 |
| 2019/0304524 A1 | 10/2019 | Oguz et al. | |
| 2021/0104663 A1* | 4/2021 | Haq | H01L 43/04 |

* cited by examiner

METHODS FOR ETCHING A STRUCTURE FOR MRAM APPLICATIONS

FIELD

Embodiments of the disclosure relate to methods for fabricating structures used in magnetoresistive random access memory (MRAM) applications. More specifically, embodiments of the disclosure relate to methods for fabricating magnetic tunnel junction structures for MRAM applications.

BACKGROUND

Magnetoresistive random access memory (MRAM) is a type of memory device containing an array of MRAM cells that store data using their resistance values instead of electronic charges. Generally, each MRAM cell includes a magnetic tunnel junction (MTJ) structure. The MTJ structure may have adjustable resistance to represent a logic state "0" or "1." The MTJ structure typically includes a stack of magnetic layers having a configuration in which two ferromagnetic layers are separated by a thin non-magnetic dielectric, e.g., an insulating tunneling layer. A top electrode and a bottom electrode are utilized to sandwich the MTJ structure so electric current may flow between the top and the bottom electrode.

One ferromagnetic layer, e.g., a reference layer, is characterized by a magnetization with a fixed direction. The other ferromagnetic layer, e.g., a storage layer, is characterized by a magnetization with a direction that is varied upon writing of the device, such as by applying a magnetic field. In some devices, an insulator material, such as a dielectric oxide layer, may be formed as a thin tunneling barrier layer sandwiched between the ferromagnetic layers. The layers are typically deposited sequentially as overlying blanketed films. The ferromagnetic layers and the insulator material are subsequently patterned by various etching processes in which one or more layers are removed, either partially or totally, in order to form a device feature.

When the respective magnetizations of the reference layer and the storage layer are antiparallel, a resistance of the magnetic tunnel junction is high having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which is derived from a reference cell or a group of reference cells and represents an in-between resistance value between that of the high logic state "1" and the low logic state "0".

While manufacturing the magnetic tunnel junction (MTJ) structure, multiple materials are required to be stacked. However, such materials may have different film properties, resulting in poor interface control and management, and eventually leading to film peeling or damaged film structures of the ferromagnetic layers in the following manufacturing process. Poor interface control may cause the film bonding structures or properties formed in an undesirable manner, such as insufficient crystallization of the film layer, thus leading to failure of the device to meet its intended performance.

Therefore, there is a need in the art for improved methods and apparatus for fabricating MTJ structures for MRAM applications.

SUMMARY

Embodiments of the disclosure provide methods and apparatus for fabricating and patterning magnetic tunnel junction (MTJ) structures on a substrate for MRAM applications. In one embodiment, a method for forming a magnetic tunnel junction (MTJ) device structure includes performing a patterning process by an ion beam etching process in a processing chamber to pattern a film stack disposed on a substrate, wherein the film stack comprises a reference layer, a tunneling barrier layer and a free layer disposed on the tunneling barrier, and determining an end point for the patterning process In another embodiment, a method for forming a magnetic tunnel junction (MTJ) device structure includes patterning a film stack disposed on a substrate by an ion beam etching process in a processing chamber, wherein the film stack comprises a reference layer, a tunneling barrier layer and a free layer disposed on the tunneling barrier, and determining an end point by an end point detector incorporated in the processing chamber.

In yet another embodiment, a method for forming a magnetic tunnel junction (MTJ) device structure includes patterning a film stack disposed on a substrate by an ion beam etching process in a processing chamber, wherein the film stack comprises a reference layer, a tunneling barrier layer and a free layer disposed on the tunneling barrier, determining an end point by an optical emission spectroscopy in the processing chamber, and forming a passivation layer on the patterned film stack.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings.

To facilitate understanding, identical reference numerals have been used, where possible, to designate identical elements that are common to the figures. It is contemplated that elements disclosed in one embodiment may be beneficially utilized on other embodiments without specific recitation.

It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure generally provide apparatus and methods for forming and patterning a MTJ structure disposed on a substrate for MRAM applications. The embodiments of the disclosure may be used suitable MRAM applications. In one embodiment, the MTJ structure may be patterned by an etching chamber equipped with an end point detector. Such end point detector may detect certain species or ions released during the patterning/etching process. Thus, by appearance of certain species as detected during the patterning/etching process, an end point may be determined, thus eliminating the likelihood of damage to the underlying or adjacent layers caused by over-etching. Thus, an accurate etching/patterning control may be obtained when manufacturing the MTJ structure.

Figure 1:
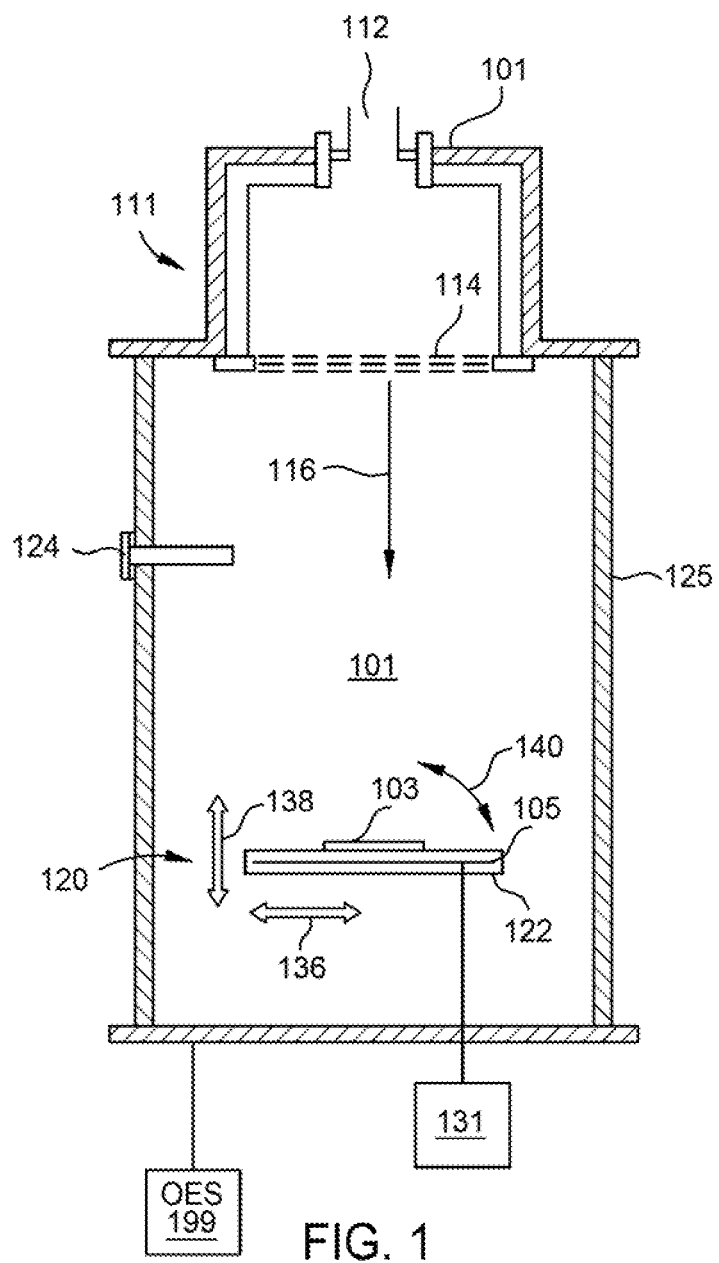
FIG. 1 depicts one embodiment of a processing chamber for practice one embodiment of the present disclosure.

FIG. 1 schematically illustrates an ion beam processing chamber 100 which may be used for implementing processes in accordance with the present disclosure. The ion beam processing chamber 100 includes an ion source 111 coupled to a chamber body 125. A processing region 101 is defined in the chamber body 120.

In one example, a plasma may be generated in the ion source 111 via inductively or capacitively coupled RF excitation of a process gas (or gas mixture) supplied to the ion source 111 via process gas inlet 112. A voltage) may be applied to grids 114 to form a collimated ion beam 116 from the plasma formed within ion source 111.

A gas inlet 124 may be formed in the chamber body 125 configured to supply different types of processing gases to the processing region 101. The processing region 101 includes substrate support assembly 122. A substrate support assembly 122 is utilized to support a substrate 103 during processing. The substrate support assembly 112 may include an electrostatic chuck (ESC) for holding the substrate 103 during processing. The electrostatic chuck (ESC) uses electrostatic attraction to hold the substrate 103 to the substrate support assembly 122. The ESC comprises a chucking electrode 105 embedded within a dielectric body. A voltage power generator 131 is coupled to the electrode 105 or other electrode within the substrate support assembly 122. The voltage power generator 122 may facilitate supplying a voltage to the electrode 105 so as to chuck or release the substrate 103 disposed on the substrate support assembly 122 during and after the process as needed. The ESC may optionally include heaters (not shown) for heating the substrate as needed.

The substrate support assembly 122 comprises a translation mechanism configured to control the movement of substrate support assembly 122. An actuator system (not shown) may also be utilized to assist control and movement of the substrate support assembly 122. For example, the substrate support assembly 122 may be moved in an X-Y direction, as indicated at the arrow 136, or in Z-direction 138, as shown by the arrow 138. Furthermore, the substrate support assembly 122 may be vertically or horizontally rotated, tilted, or oscillated, as shown by the arrow 140, as needed. It is noted that the substrate support assembly 122 may be rotated, tilted, or oscillated clockwise or counter-clockwise as needed. In one example, the substrate support assembly 122 is pivotally mounted such that the angle of incidence of collimated ion beam 116 relative to a normal to the substrate surface may be adjusted in situ (i.e., during a process, without breaking vacuum) as needed.

During operation of the ion beam processing chamber 100, such as for etching the substrate 103, the substrate support assembly 122 may be scanned relative to the grids 114. As the substrate 103 is scanned thusly, the processing gas supplied by the gas source 124 may be controllably fed through an extraction plate (not shown). In one example, processing gas may be sprayed directly onto the substrate 103 with the surface being positioned in close proximity (e.g., 5-25 millimeters) to gas orifices from the extraction plate as the processing gas is applied thereto. The processing gas emitted from the gas orifices from gas inlet 124 is relatively concentrated and undiffused when received by the surface of the substrate 103, resulting in higher surface coverage and a higher gas-surface collision rate, and thus providing a more effective and more efficient application of processing gas relative to conventional shower head gas delivery systems.

An end point detector 199 may be coupled to the radio-frequency inductively coupled plasma (RF-ICP) ion source processing chamber 100. The end point detector 199 may be an optical emission spectroscopy (OES), a secondary-ion mass spectrometry (SIMS), a signal detector, a secondary-ion mass spectrometry (SIMS), an optical detector, combinations thereof, or suitable sensors or detectors associated with the radio-frequency inductively coupled plasma (RF-ICP) ion source processing chamber 100 that may be utilized to detect the species in the radio-frequency inductively coupled plasma (RF-ICP) ion source processing chamber 100, such as in the interior processing region 101, e.g., approximate to the surface of the substrate, defined in the ion source processing chamber 100. In operation, the end point detector 199 may transmit signals to the controller in FIG. 1 for the analysis. The end point detector 199 detects signals of the species above the substrate surface may include intensity of certain species, ion concentration and other suitable signals that may be collected during the process. The controller may then assist comparing and analyzing the signals received during operations of the ion source processing chamber 100 to properly determine an end point for the process.

Figure 2:
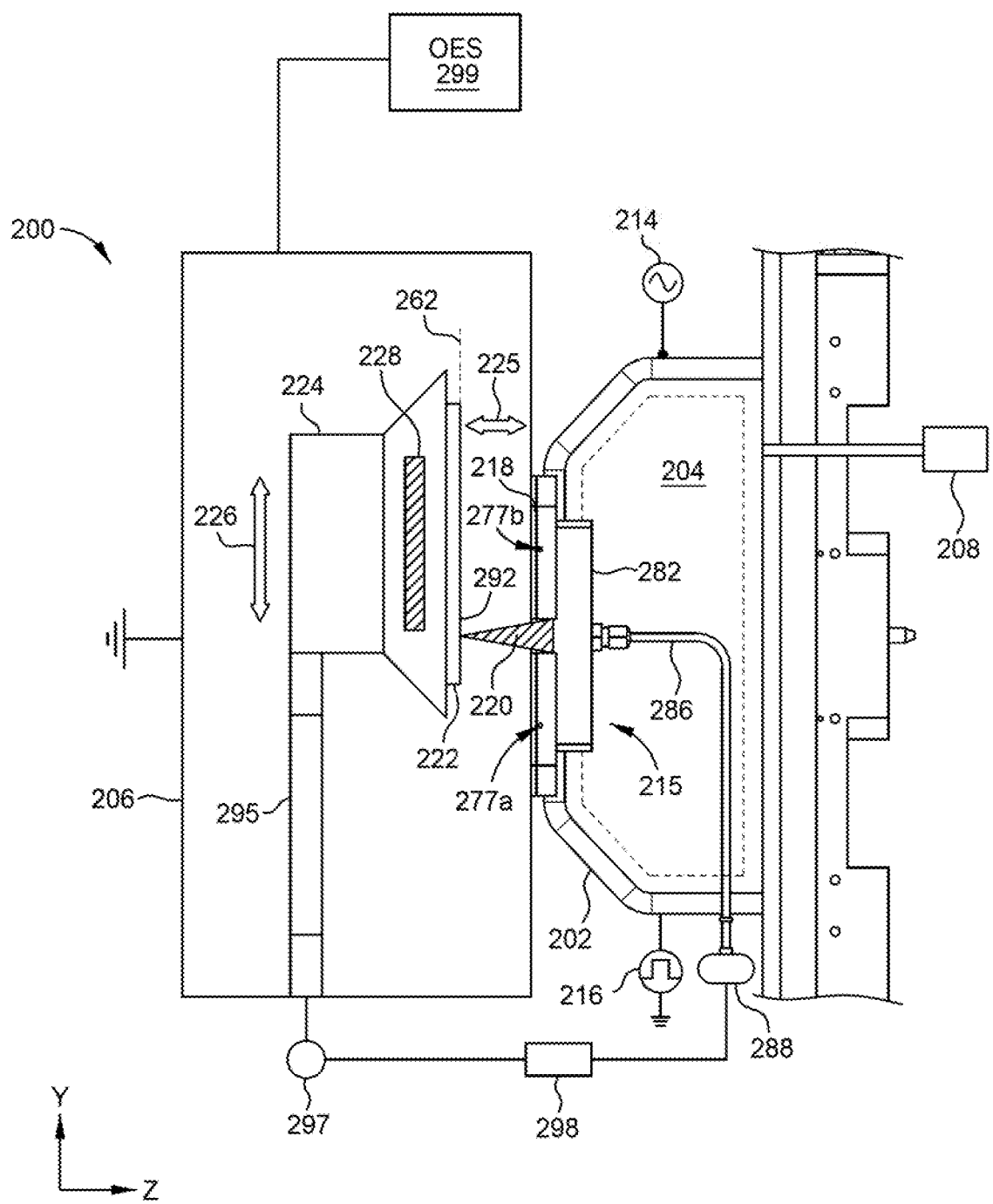
FIG. 2 depicts an apparatus chamber for practice one embodiment of the present disclosure.

FIG. 2 is a sectional view of another embodiment of a processing chamber, such as another example of an ion beam etching chamber 200, suitable for providing ions, dopants or etchants into a substrate so as to react with the materials from the substrate. Suitable processing chambers that may be adapted for use with the teachings disclosed herein include, such as the Varian Raptor® system available from Applied Materials, Inc. of Santa Clara, Calif.

The ion beam etching chamber 200 includes a plasma reactor 202 may house a plasma 204 as illustrated. The ion beam etching chamber 200 further may further include a source reactor 206. The ion beam etching chamber 200 may include at least one gas source 208 to provide a working gas (described below) to the plasma reactor 202. The ion beam etching chamber 200 may further include a power source, shown as the plasma power source 214, to generate power to ignite and sustain the plasma 204. The plasma power source 214 may be an RF power source, inductively-coupled plasma (ICP) source, capacitively coupled plasma (CCP) source, helicon source, electron cyclotron resonance (ECR) source, indirectly heated cathode (IHC) source, glow discharge source, or other plasma sources known to those skilled in the art. The ion beam etching chamber 200 may further include a gas injection system 215 for introducing a residue removal gas into the source reactor 206 as further described below.

The ion beam etching chamber 200 may further include a bias supply 216 coupled to the plasma reactor 202. The bias supply 216 may be configured to generate a voltage difference between the plasma reactor 202 and a substrate stage 224 disposed in the source reactor 206. In the embodiment of FIG. 2, the bias supply 216 may bias the plasma reactor 202 positively with respect to ground potential, while the source reactor 206 as well as substrate stage 224 is held at ground potential. When the plasma 204 is present in the plasma reactor 202, and the bias supply 216 biases the plasma reactor 202 positively with respect to ground potential, an ion beam 220 comprising positive ions may be extracted from the plasma 204. In other embodiments of the ion beam etching chamber 200, the plasma reactor 202 may be held at ground potential and the substrate 222 and substrate stage 224 may be biased positively with respect to ground potential.

The ion beam 220 may be extracted through an extraction plate 218, and may be directed into the source reactor 206 to the substrate 222 held on the substrate stage 224. In various embodiments, the substrate stage 224 may be movable with respect to the extraction plate 218. For example, the substrate stage 224 may be movable in a direction parallel to the Z-axis of the Cartesian coordinate system shown as indicated by arrow 225. In this manner, a distance between the surface of the substrate 222 and extraction plate 218 may be varied. In various embodiments, the substrate stage 224 may be configured to scan the substrate 222 relative to the extraction plate 218 in a direction parallel to the plane 262 of the substrate 222. For example, as shown in FIG. 2, the substrate stage 224 may be vertically movable parallel to the Y-axis as indicated by arrow 226. As further shown in FIG. 2, the substrate stage 224 may include a heater 228 for heating the substrate 222.

In accordance with various embodiments of the present disclosure, the gas source 208 of the ion beam etching chamber 200 may supply one more feed gases to the plasma reactor 202 for use in generating the plasma 204. Such feed gases may include neon gas, xenon gas, and argon gas. Ion beams extracted from plasma formed from one or more of the aforementioned noble gases have been found to be effective for etching various substrate materials, including silicon.

The gas source 288 may contain one or more residue removal gases selected for their ability to react with sputtered atoms from the etched surface 292 of the substrate 222 to form volatile molecules for subsequent removal from the process source reactor 206 of the ion beam etching chamber 200. Such residue removal gases may include, and are not limited to, methanol, ethanol, isopropanol, acetone, carbon monoxide, carbon dioxide, ammonia, nitrous oxide, ethylene glycol, chlorine, fluorine, nitrogen trifluoride and hydrogen cyanide.

Embodiments of the gas injection system 215 are contemplated wherein the extraction plate 218 is provided with a greater or fewer number of gas distributors (and respective recesses and gas conduits) than described above. During operation of the ion beam etching chamber 200, such as for etching a substrate 222 disposed on the substrate stage 224 as shown in FIG. 2, the substrate stage 224 may be scanned relative to the extraction plate 218 in the manner described above. For example, the substrate stage 224 may be scanned vertically relative to the extraction plate 218 in order to expose the substrate 222 to the ion beam 220 as projected.

As the substrate stage 224 is scanned thusly, residue removal gas supplied by the gas source 288 may be controllably fed through the gas supply line 286 and the gas manifold 282 to the first and second gas conduits of the extraction plate 218. In one example, the residue removal gas may be sprayed directly onto the moving surface 292 of the substrate 222, with the surface 292 being positioned in close proximity (e.g., 5-25 millimeters) to the gas orifices 277a, 277b as the residue removal gas is applied thereto.

Owning to the relatively short distance between the gas orifices 277a, 277b and the surface 292 of the substrate 222, the gas injection system 215 may apply residue removal gas to the surface 292 at a lower flow rate and at a higher pressure relative to conventional shower head gas delivery systems, wherein residue removal gas is introduced into a process chamber at a significant distance (e.g., 25-200 millimeters) from a substrate and is allowed to diffuse throughout the process chamber before passively settling onto a surface of the substrate. Thus, the residue removal gas emitted from the gas orifices 277a, 277b of the gas injection system 215 is relatively concentrated and undiffused when received by the surface 292, resulting in higher surface coverage and a higher gas-surface collision rate, and thus providing a more effective and more efficient application of residue removal gas relative to conventional shower head gas delivery systems. Thus, the total amount of residue removal gas necessary for processing a substrate may be reduced while the efficacy of the residue removal gas is enhanced relative to conventional shower head gas delivery systems.

Additionally, since there is no need for a separate showerhead structure in the source reactor 206, the source reactor 206 may be made smaller, and the ion beam etching chamber 200 may thus have a smaller form factor, than ion beam etching chamber 200 employing conventional showerhead gas delivery systems. Still further, since the residue removal gas is emitted from the gas orifices 277a, 277b in the form of concentrated jets directly onto the surface 292 of the substrate 222, the residue removal gas may be applied to the surface 292 in a precise, targeted manner before, during, and/or after etching of the substrate 222.

An end point detector 299 may be coupled to the ion beam etching chamber 200. The end point detector 299 may be an optical emission spectroscopy (OES), a secondary-ion mass spectrometry (SIMS), a signal detector, an optical detector, combinations thereof, or suitable sensors or detectors associated with the ion beam etching chamber that may be utilized to detect the species in the ion beam etching chamber, e.g., approximate to the surface of the substrate 301, defined in the ion beam etching chamber 200. In operation, the end point detector 299 may transmit signals to a controller 298 in the ion beam etching chamber 200 for the analysis. The end point detector 299 detects signals of the species above the substrate surface may include intensity of certain species, ion concentration and other suitable signals that may be collected during the process. The controller 298 may then assist comparing and analyzing the signals received during operations of the ion beam etching chamber 200 to properly determine an end point for the process.

The ion beam etching chamber 200 may include the controller 298 operatively connected to the gas source 288 for controlling the delivery of residue removal gas to the extraction plate 218 in a predetermined (e.g., preprogrammed) manner. For example, the controller 298 may be operatively connected to a drive mechanism 297 that drives the substrate stage 224 (via support arm 295) during scanning of the substrate 222, and the controller 298 may be programmed to coordinate the delivery of residue removal gas to the extraction plate 218, and thus the emission of residue removal gas from the gas orifices 277a, 277b, with the position and movement of the substrate stage 224 to deliver the residue removal gas to the substrate 222 in a desired manner as well as receiving the signal/determination/command from the end point detector 299. In one example, the controller 298 may control a rate of the residue removal gas delivered to the extraction plate 218 for varying the pressure of the residue removal gas emitted from the gas orifices 277a, 277b.

Figure 3:
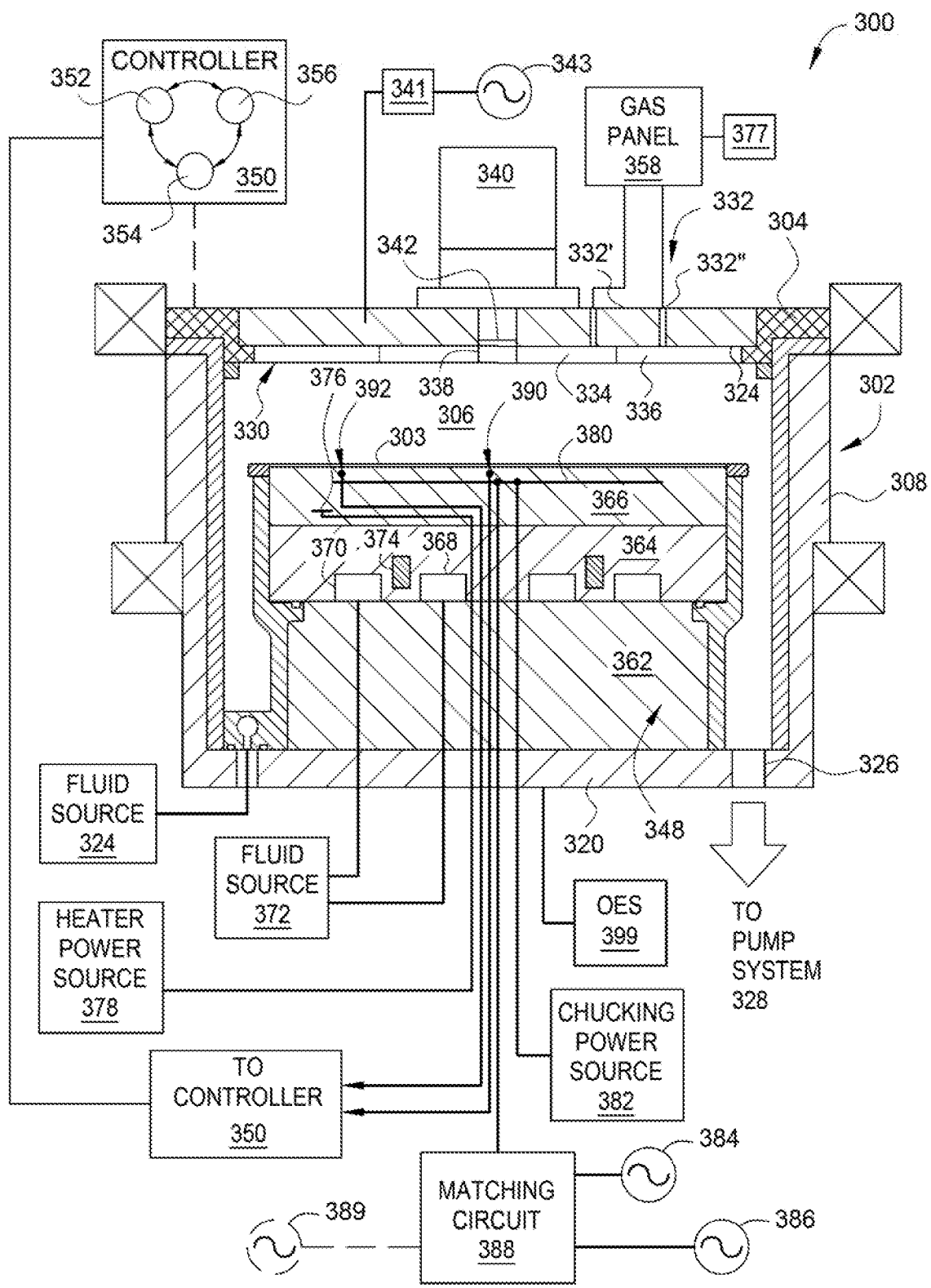
FIG. 3 depicts one embodiment of a processing chamber for practice one embodiment of the present disclosure.

FIG. 3 is a sectional view of one example of a processing chamber 300 suitable for performing a patterning process to etch a film stack disposed on a substrate. Suitable processing chambers that may be adapted for use with the teachings disclosed herein include, for example, an ENABLER®, SYM3® or AdvantEdge Mesa® processing chamber available from Applied Materials, Inc. of Santa Clara, Calif. Although the processing chamber 300 is shown including a plurality of features that enable superior etching performance, it is contemplated that other processing chambers may be adapted to benefit from one or more of the inventive features disclosed herein.

The processing chamber 300 includes a chamber body 302 and a lid 304 which enclose an interior volume 306. The chamber body 302 is typically fabricated from aluminum, stainless steel or other suitable material. The chamber body 302 generally includes sidewalls 308 and a bottom 310. A substrate support pedestal access port (not shown) is generally defined in a sidewall 308 and a selectively sealed by a slit valve to facilitate entry and egress of a substrate 303 from the processing chamber 300. An exhaust port 226 is defined in the chamber body 302 and couples the interior volume 306 to a pump system 328. The pump system 328 generally includes one or more pumps and throttle valves utilized to evacuate and regulate the pressure of the interior volume 306 of the processing chamber 300. In one implementation, the pump system 328 maintains the pressure inside the interior volume 306 at operating pressures typically between about 10 mTorr to about 500 Torr.

The lid 304 is sealingly supported on the sidewall 308 of the chamber body 302. The lid 304 may be opened to allow excess to the interior volume 306 of the processing chamber 300. The lid 304 includes a window 342 that facilitates optical process monitoring. In one implementation, the window 342 is comprised of quartz or other suitable material that is transmissive to a signal utilized by an optical monitoring system 340 mounted outside the processing chamber 300.

The optical monitoring system 340 is positioned to view at least one of the interior volume 306 of the chamber body 302 and/or the substrate 303 positioned on a substrate support pedestal assembly 348 through the window 342. In one embodiment, the optical monitoring system 340 is coupled to the lid 304 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the disclosure is the EyeD® full-spectrum, interferometric metrology module, available from Applied Materials, Inc., of Santa Clara, Calif.

Alternatively, the optical monitoring system 340 may also serve as an end point detector, such as an optical emission spectroscopy (OES), a secondary-ion mass spectrometry (SIMS), a signal detector, an optical detector, combinations thereof, or suitable sensors or detectors associated with the processing chamber 300. The end point detector may be utilized to detect the species in the processing chamber 300, such as in the interior volume 306, e.g., approximate to the surface of the substrate 303. In operation, the end point detector may transmit signals to the controller, such as the controller 350 depicted in FIG. 3, for the analysis. The end point detector detects signals of the species above the substrate surface may include intensity of certain species, ion concentration and other suitable signals that may be collected during the process. The controller 350 may then assist comparing and analyzing the signals received during operations of the etching chamber 300 to properly determine an end point for the process.

In another embodiment, instead of utilizing the optical monitoring system 340, an additional end point detector 399 may be coupled to the processing chamber 300. Similarly, as discussed above, the end point detector 399 may detect the species in the processing chamber 300 approximate to the surface of the substrate 303. In operation, the end point detector may transmit signals to the controller, such as the controller 350 depicted in FIG. 3, for the analysis. The end point detector detects signals of the species above the substrate surface may include intensity of certain species, ion concentration and other suitable signals that may be collected during the process.

A gas panel 358 is coupled to the processing chamber 300 to provide process and/or cleaning gases to the interior volume 306. In the example depicted in FIG. 3, inlet ports 332', 332" are provided in the lid 304 to allow gases to be delivered from the gas panel 358 to the interior volume 306 of the processing chamber 300. In one implementation, the gas panel 358 is adapted to provide fluorinated process gas through the inlet ports 332', 332" and into the interior volume 306 of the processing chamber 300. In one implementation, the process gas provided from the gas panel 358 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, CO, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include HCl, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 330 is coupled to an interior surface 314 of the lid 304. The showerhead assembly 330 includes a plurality of apertures that allow the gases flowing through the showerhead assembly 330 from the inlet ports 332', 332" into the interior volume 306 of the processing chamber 300 in a predefined distribution across the surface of the substrate 303 being processed in the processing chamber 300.

A remote plasma source 377 may be optionally coupled to the gas panel 358 to facilitate dissociating gas mixture from a remote plasma prior to entering into the interior volume 306 for processing. A RF source power 343 is coupled through a matching network 341 to the showerhead assembly 330. The RF source power 343 typically is capable of producing up to about 3000 W at a tunable frequency in a range from about 50 kHz to about 200 MHz.

The showerhead assembly 330 additionally includes a region transmissive to an optical metrology signal. The optically transmissive region or passage 338 is suitable for allowing the optical monitoring system 340 to view the interior volume 306 and/or the substrate 303 positioned on the substrate support pedestal assembly 348. The passage 338 may be a material, an aperture or plurality of apertures formed or disposed in the showerhead assembly 330 that is substantially transmissive to the wavelengths of energy generated by, and reflected back to, the optical monitoring system 340. In one embodiment, the passage 238 includes a window 342 to prevent gas leakage through the passage 338. The window 342 may be a sapphire plate, quartz plate or other suitable material. The window 342 may alternatively be disposed in the lid 304.

In one implementation, the showerhead assembly 330 is configured with a plurality of zones that allow for separate control of gas flowing into the interior volume 206 of the processing chamber 300. In the example illustrated in FIG. 3, the showerhead assembly 330 as an inner zone 334 and an outer zone 336 that are separately coupled to the gas panel 358 through separate inlet ports 332', 332".

The substrate support pedestal assembly 348 is disposed in the interior volume 306 of the processing chamber 300 below the gas distribution (showerhead) assembly 330. The substrate support pedestal assembly 348 holds the substrate 303 during processing. The substrate support pedestal assembly 348 generally includes a plurality of lift pins (not shown) disposed therethrough that are configured to lift the substrate 303 from the substrate support pedestal assembly 348 and facilitate exchange of the substrate 303 with a robot (not shown) in a conventional manner. An inner liner 318 may closely circumscribe the periphery of the substrate support pedestal assembly 348.

In one implementation, the substrate support pedestal assembly 348 includes a mounting plate 362, a base 364 and an electrostatic chuck 366. The mounting plate 362 is coupled to the bottom 310 of the chamber body 302 includes passages for routing utilities, such as fluids, power lines and sensor leads, among others, to the base 364 and the electrostatic chuck 366. The electrostatic chuck 366 comprises at least one clamping electrode 380 for retaining the substrate 303 below showerhead assembly 330. The electrostatic chuck 366 is driven by a chucking power source 382 to develop an electrostatic force that holds the substrate 303 to the chuck surface, as is conventionally known. Alternatively, the substrate 303 may be retained to the substrate support pedestal assembly 348 by clamping, vacuum or gravity.

At least one of the base 364 or electrostatic chuck 366 may include at least one optional embedded heater 376, at least one optional embedded isolator 374 and a plurality of conduits 368, 370 to control the lateral temperature profile of the substrate support pedestal assembly 348. The conduits 368, 370 are fluidly coupled to a fluid source 372 that circulates a temperature regulating fluid therethrough. The heater 376 is regulated by a power source 378. The conduits 368, 370 and heater 376 are utilized to control the temperature of the base 364, thereby heating and/or cooling the electrostatic chuck 366 and ultimately, the temperature profile of the substrate 303 disposed thereon. The temperature of the electrostatic chuck 366 and the base 364 may be monitored using a plurality of temperature sensors 390, 392. The electrostatic chuck 366 may further comprise a plurality of gas passages (not shown), such as grooves, that are formed in a substrate support pedestal supporting surface of the chuck 366 and fluidly coupled to a source of a heat transfer (or backside) gas, such as He. In operation, the backside gas is provided at controlled pressure into the gas passages to enhance the heat transfer between the electrostatic chuck 366 and the substrate 303.

In one implementation, the substrate support pedestal assembly 348 is configured as a cathode and includes an electrode 380 that is coupled to a plurality of RF power bias sources 384, 386. The RF bias power sources 384, 386 are coupled between the electrode 380 disposed in the substrate support pedestal assembly 348 and another electrode, such as the showerhead assembly 330 or ceiling (lid 304) of the chamber body 302. The RF bias power excites and sustains a plasma discharge formed from the gases disposed in the processing region of the chamber body 302.

In the example depicted in FIG. 3, the dual RF bias power sources 384, 386 are coupled to the electrode 380 disposed in the substrate support pedestal assembly 348 through a matching circuit 388. The signal generated by the RF bias power sources 384, 386 is delivered through matching circuit 388 to the substrate support pedestal assembly 348 through a single feed to ionize the gas mixture provided in the plasma processing chamber 300, thus providing ion energy necessary for performing a deposition or other plasma enhanced process. The RF bias power sources 384, 386 are generally capable of producing an RF signal having a frequency of from about 50 kHz to about 200 MHz and a power between about 0 Watts and about 5000 Watts. An additional bias power source 389 may be coupled to the electrode 380 to control the characteristics of the plasma.

In one mode of operation, the substrate 303 is disposed on the substrate support pedestal assembly 348 in the plasma processing chamber 300. A process gas and/or gas mixture is introduced into the chamber body 302 through the showerhead assembly 330 from the gas panel 358. A vacuum pump system 328 maintains the pressure inside the chamber body 302 while removing deposition by-products.

A controller 350 is coupled to the processing chamber 300 to control operation of the processing chamber 300. The controller 350 includes a central processing unit (CPU) 352, a memory 354, and a support circuit 356 utilized to control the process sequence and regulate the gas flows from the gas panel 358. The CPU 352 may be any form of general purpose computer processor that may be used in an industrial setting. The software routines can be stored in the memory 354, such as random access memory, read only memory, floppy, or hard disk drive, or other form of digital storage. The support circuit 356 is conventionally coupled to the CPU 352 and may include cache, clock circuits, input/output systems, power supplies, and the like. Bi-directional communications between the controller 350 and the various components of the processing chamber 300 are handled through numerous signal cables.

Figure 4:
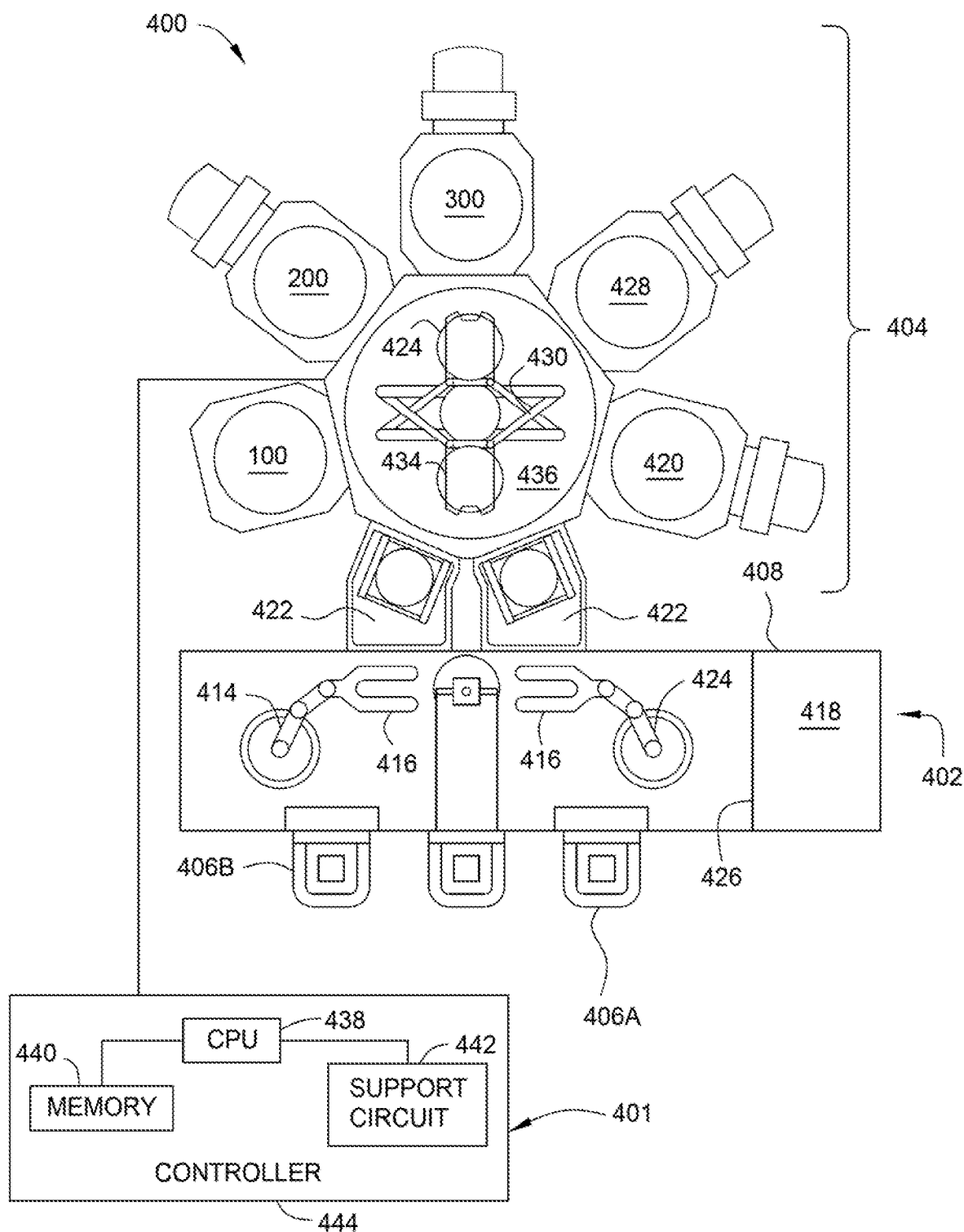
FIG. 4 depicts another embodiment of a cluster processing system for practice one embodiment of the present disclosure.

FIG. 4 is a schematic top plan view of an exemplary cluster processing system 400 that includes one or more of the processing chambers 100, 200, 300, 428, 420 that are incorporated and integrated therein. In one embodiment, the cluster processing system 400 may be a CENTURA® or ENDURA® integrated processing system, commercially available from Applied Materials, Inc., located in Santa Clara, Calif. It is contemplated that other processing systems (including those from other manufacturers) may be adapted to benefit from the disclosure.

The cluster processing system 400 includes a vacuum-tight processing platform 404, a factory interface 402, and a system controller 444. The platform 404 includes a plurality of processing chambers 100, 200, 300, 428, 420 and at least one load-lock chamber 422 that is coupled to a vacuum substrate transfer chamber 436. Two load lock chambers 422 are shown in FIG. 4. The factory interface 402 is coupled to the transfer chamber 436 by the load lock chambers 422.

In one embodiment, the factory interface 402 comprises at least one docking station 408 and at least one factory interface robot 414 to facilitate transfer of substrates. The docking station 408 is configured to accept one or more front opening unified pod (FOUP). Two FOUPS 406A-B are shown in the embodiment of FIG. 4. The factory interface robot 414 having a blade 416 disposed on one end of the robot 414 is configured to transfer the substrate from the factory interface 402 to the processing platform 404 for processing through the load lock chambers 422. Optionally, one or more metrology stations 418 may be connected to a terminal 426 of the factory interface 402 to facilitate measurement of the substrate from the FOUPS 406A-B.

Each of the load lock chambers 422 have a first port coupled to the factory interface 402 and a second port coupled to the transfer chamber 436. The load lock chambers 422 are coupled to a pressure control system (not shown) which pumps down and vents the load lock chambers 422 to facilitate passing the substrate between the vacuum environment of the transfer chamber 436 and the substantially ambient (e.g., atmospheric) environment of the factory interface 402.

The transfer chamber 436 has a vacuum robot 430 disposed therein. The vacuum robot 430 has a blade 434 capable of transferring substrates 424 among the load lock chambers 422, the metrology system 410 and the processing chambers 100, 200, 332, 428, 420.

In one embodiment of the cluster processing system 400, the cluster processing system 400 may include one or more processing chambers 100, 200, 300, 428, 420, which may be a deposition chamber (e.g., physical vapor deposition chamber, chemical vapor deposition, or other deposition chambers), annealing chamber (e.g., high pressure annealing chamber, RTP chamber, laser anneal chamber), etch chamber, cleaning chamber, curing chamber, lithographic exposure chamber, or other similar type of semiconductor processing chambers. In some embodiments of the cluster processing system 300, one or more of processing chambers 100, 200, 300, 428, 420, the transfer chamber 436, the factory interface 402 and/or at least one of the load lock chambers 422.

The system controller 444 is coupled to the cluster processing system 400. The system controller 444, which may include the computing device 401 or be included within the computing device 401, controls the operation of the cluster processing system 300 using a direct control of the processing chambers 100, 200, 300, 428, 420 of the cluster processing system 400. Alternatively, the system controller 444 may control the computers (or controllers) associated with the processing chambers 100, 200, 300, 428, 420 and the cluster processing system 400. In operation, the system controller 444 also enables data collection and feedback from the respective chambers to optimize performance of the cluster processing system 400.

The system controller 444, much like the computing device 401 described above, generally includes a central processing unit (CPU) 438, a memory 440, and support circuits 442. The CPU 438 may be one of any form of a general purpose computer processor that can be used in an industrial setting. The support circuits 442 are conventionally coupled to the CPU 438 and may comprise cache, clock circuits, input/output subsystems, power supplies, and the like. The software routines transform the CPU 438 into a specific purpose computer (controller) 444. The software routines may also be stored and/or executed by a second controller (not shown) that is located remotely from the cluster processing system 400.

Figure 5:
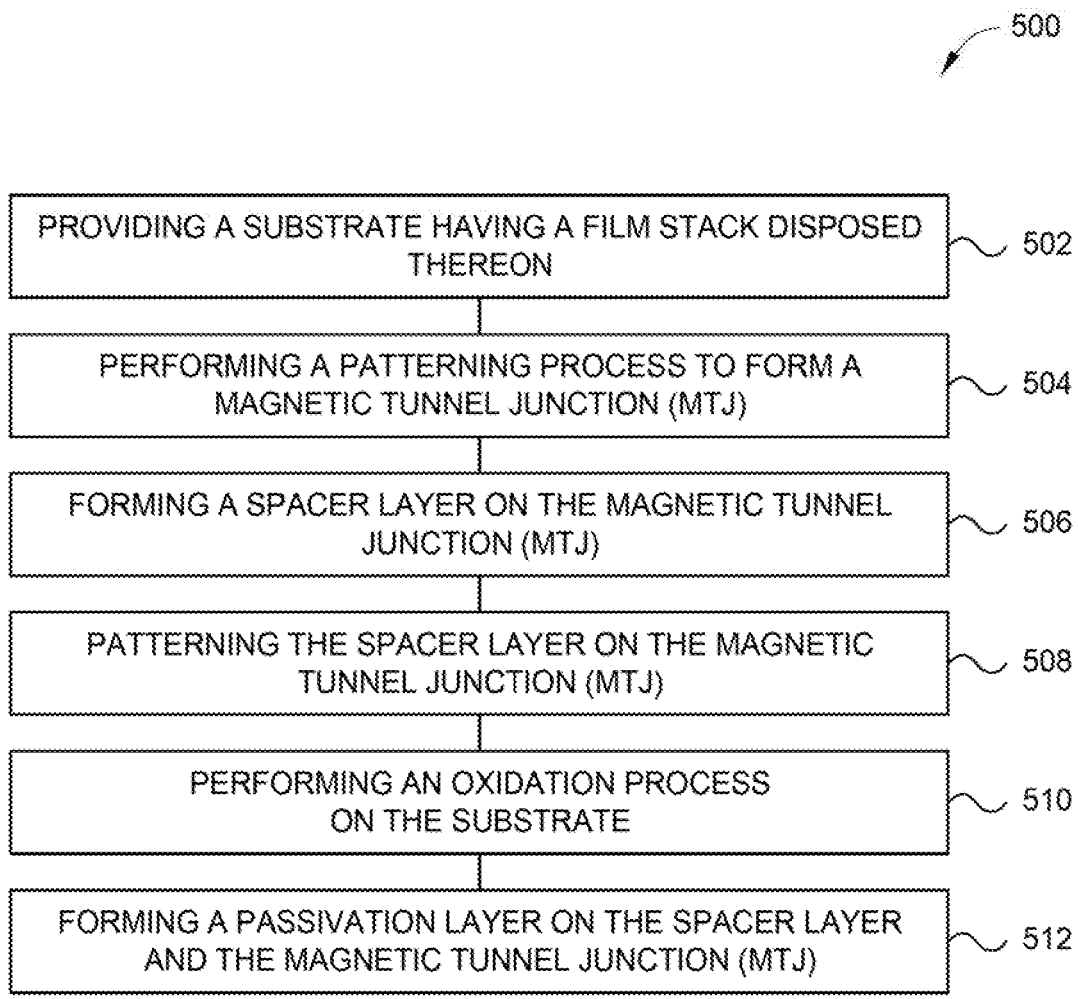
FIG. 5 depicts a flow diagram illustrating a method for fabricating magnetic tunnel junction (MTJ) structures along with a back end interconnection structure according to one embodiment of the present disclosure.

FIG. 5 depicts a flow diagram illustrating a process 500 for manufacturing MTJ structures on a substrate for MRAM applications according to one embodiment of the present disclosure. It is noted that the process 500 for manufacturing MTJ structures may be utilized in spin-orbit-torque magnetic random access memory (SOT MRAM), spin-transfer-torque magnetic random access memory (STT MRAM), and/or the hybrid (or called integrated) spin-orbit-torque magnetic spin-transfer-torque magnetic random access memory (SOT-STT MRAM) applications, particularly in spin-orbit-torque magnetic random access memory (SOT MRAM). FIGS. 6A-6G are schematic cross-sectional views of MTJ structure formed on a substrate 602 at various stages of the process of FIG. 5. It is contemplated that the process 500 may be performed in suitable processing chambers, such as the ion source processing chamber 100 depicted in FIG. 1, the ion etching chamber 200 depicted in FIG. 2, the etching chamber 300 depicted in FIG. 3, a deposition chamber (not shown) or other suitable processing chambers including deposition chambers, patterning chambers or other suitable processing chambers incorporated in the cluster processing systems 400 depicted in FIG. 4. It is also noted that the process 500 may be performed in suitable processing chambers, including those from other manufacturers.

Figure 6A:
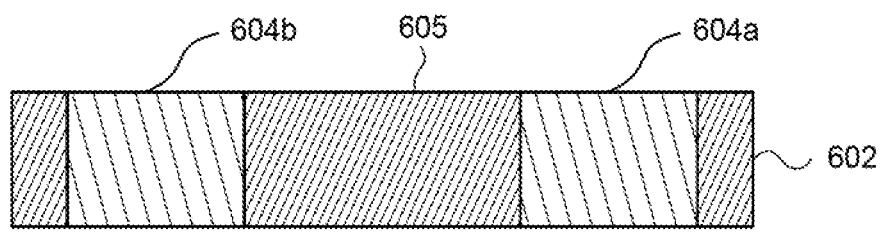
FIGS. 6A-6G are cross sectional views of a substrate at various stages of the method of FIG. 5.

The process 500 begins at operation 502 by providing a substrate, such as the substrate 602 having an interconnection structure, shown as 604a, 604b, formed in an insulating structure 605, as shown in FIG. 6A. The interconnection structure 604a, 604b and the insulating structure 605 may be formed in one or more of the processing chambers incorporated in the cluster processing system 400 depicted in FIG. 4. In one embodiment, the interconnection structure 604a, 604b and the insulating structure 605 may be further formed on a base (not shown) comprising metal or glass, silicon, dielectric bulk material and metal alloys or composite glass, crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The base may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter base substrate.

The insulating structure 605 may comprise a dielectric material, such as SiN, SiCN, $SiO_2$, SiON, SiC, amorphous carbon, SiOC or other suitable low dielectric constant material and the like. The interconnection structure 604a, 604b includes a metal containing material, such as aluminum, tungsten, copper, nickel, tantalum, titanium, and the like. In one example, the insulating structure 605 includes a low dielectric constant dielectric material, such as SiOC, and the interconnection structure 604a, 604b includes copper.

Figure 6B:
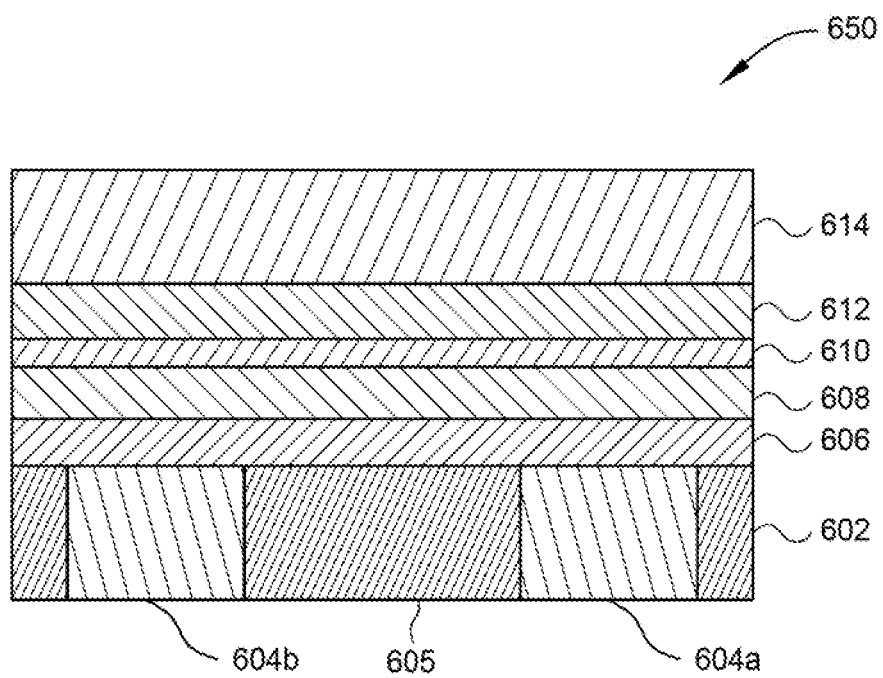

At operation 504, a film stack 650 is disposed on the substrate 602, as shown in FIG. 6B. The film stack 650 may be formed in one or more of the processing chambers incorporated in the cluster processing system 400 depicted in FIG. 4. The film stack 650 further includes a spin-orbit-torque (SOT) layer 606, a free layer 608 and a reference layer 612 sandwiching a tunneling barrier layer 610 sequentially formed on the substrate 602. A hardmask layer 614 is then formed on the reference layer 512. Though the film stack 650 described in FIGS. 6B-6G only includes five layers, it is noted that additional or multiple film layers can be further formed in the film stack 650 as needed. The tunneling barrier layer 610 may be an oxide barrier layer in the case of a tunnel junction magnetoresistive (TMR) sensor or a conductive layer in the case of a giant magnetoresistive (GMR) sensor. When the film stack 650 is configured to form a TMR sensor, then the tunneling barrier layer 610 may comprise MgO, $HfO_2$, $TiO_2$, $TaO_x$, $Al_2O_3$, or other suitable materials. In the embodiment depicted in FIGS. 6B-6G, the tunneling barrier layer 610 may comprise MgO having a thickness of about 1 to about 25 Angstroms, such about 10 Angstroms.

The free layer 608 and the reference layer 612 may be a metal containing material or a magnetic material, such as Mo, Ir, Ru, Ta, MgO, Hf, Fe, CoFe, CoFeB and the like. It is noted that the free layer 608 and the reference layer 612 may be fabricated from the same or different materials as needed. The SOT layer 606 and the hardmask layer 614 are fabricated from CoFeB, MgO, Ta, W, Pt, CuBi, Mo, Ru, Ir, alloys thereof, or combinations thereof. The hardmask layer 614 is disposed in the film stack 650 and will be later utilized as an etching mask layer during the following patterning and/or etching process.

Figure 6C:
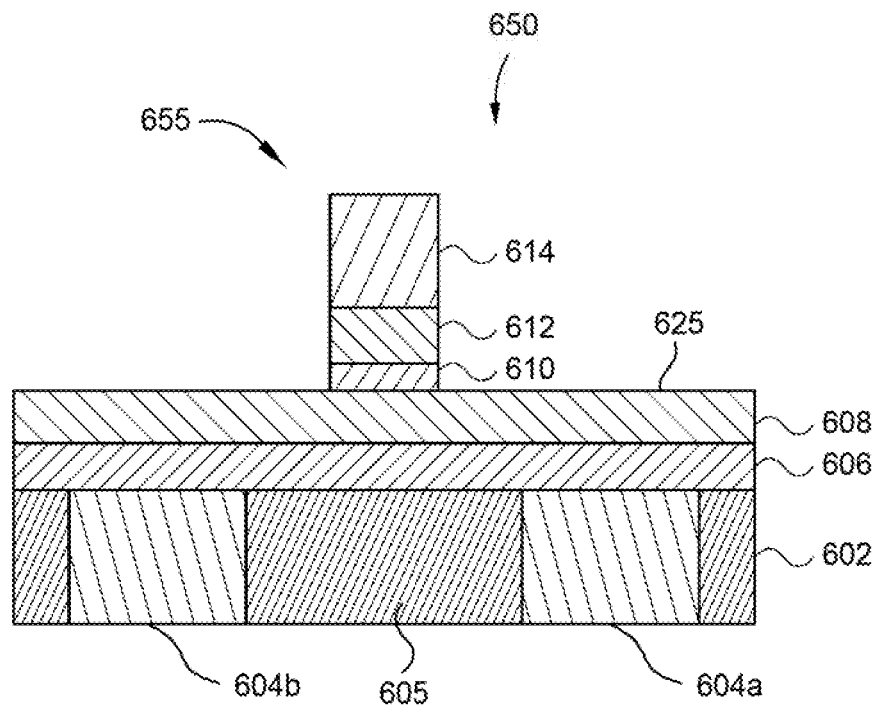
Figure 7:
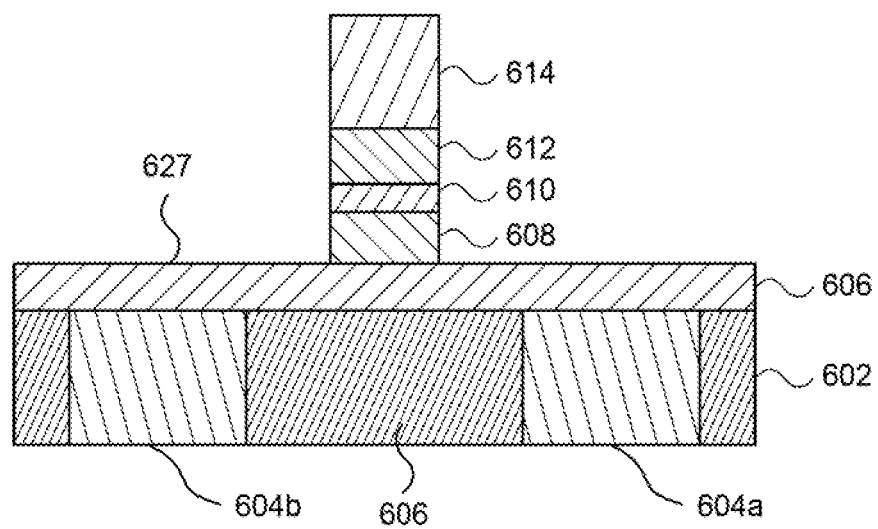
FIG. 7 is a cross sectional view of another example of a magnetic tunnel junction (MTJ) structure formed on a substrate.

At operation 504, a patterning process, e.g., an etching process, is performed to pattern the hardmask layer 614 followed by more than one patterning process to pattern (e.g., etch) the film stack 650 exposed by the patterned hardmask layer 614 form part of a magnetic tunnel junction (MTJ) structure 655, as shown in FIG. 6C, until a surface 625 of the free layer 608 is exposed, or alternatively, until a surface 627 of a spin-orbit-torque (SOT) layer 606 is exposed, as shown in FIG. 7.

The patterning processes may be performed in the ion source processing chamber 100 depicted in FIG. 1, ion beam etching chamber 200 depicted in FIG. 2 or a plasma etching chamber 300 depicted in FIG. 3, which is incorporated in the cluster processing system 400 depicted in FIG. 4, or be performed in one or more of the processing chambers incorporated in the cluster processing system 400. It is noted that the patterned hardmask layer 616 is intended to be left and remained on the film stack 650, forming as part of the magnetic tunnel junction (MTJ) structure 655 after the patterning process performed at operation 504. The patterning process for patterning the film stack 650 may include several steps or different recipes configured to supply different gas mixtures or etchants to etch different layers in accordance with the materials included in each layer.

In one example, during patterning, an etching gas mixture or several gas mixtures with different etching species are sequentially supplied into the substrate surface to remove the portion of the film stack 650 until the surface 625 of the free layer 608 is exposed, or alternatively, until the surface 627 of a spin-orbit-torque (SOT) layer 606 is exposed.

In one example, the end point of the patterning process at operation 504 may be controlled by an end point detector provided from the etching chamber. For example, the patterning process may be terminated by the determination from the endpoint detector 199, 299, 399 as shown in FIG. 1, 2 or 3, such as an OES detector, a secondary-ion mass spectrometry (SIMS), combinations thereof, or other suitable detector as needed.

During patterning, ion intensities, types of the reactive species, or other associated radicals may be detected by the endpoint detector 199, 299, 399. The signals emitted by the ions during the process may be detected by the endpoint detector 199, 299, 399. The signal is then further analyzed, or compared with the data stored in the database library. The analysis may be conducted in-time or offline as needed. The database library may be stored in the memory of the controller of the chambers 100, 200, 300 or from other statistical process control (SPC) database stored in the manufacturing facility or EDA (electronic design automation) system, with which the controller may be in communication. The data stored in the database library may be obtained from historical spectrum of different ions presented during the past processing runs.

Thus, after the received signals are analyzed and compared, an end point may be detected so that the likelihood of damaging the underlying and nearby layers may be minimized.

In the embodiment wherein the patterning process is desired to remove the film stack 650 until the surface 625 of the free layer 608 is exposed, as shown in FIG. 6C, ions of Co, Fe, and B may be set to be detected. Once the ions of Co, Fe, and B elements are detected, it indicates that the etchants from the patterning/etching process has reacted with the free layer 608, which is fabricated from a material comprising CoFeB. Thus, by tracing and detecting the intensity of the Co, Fe, and B elements, a proper end point of the etching/patterning process may be determined.

In the embodiment wherein the patterning process is desired to remove the film stack 650 until the surface 627 of the spin-orbit-torque (SOT) layer 606 is exposed, as shown in FIG. 7, ions of Mg and/or oxygen may be set to be detected. Once the ions of Mg and/or oxygen elements are detected, particularly Mg ions, it indicates that the etchants from the patterning/etching process has reacted with the spin-orbit-torque (SOT) layer 606, which is fabricated from a material comprising MgO. Thus, by tracing and detecting the intensity of the Mg and/or O elements, a proper end point of the etching/patterning process may be determined.

Furthermore, in one example, the patterning/etching process at operation 504 is an ion beam etching process. During the ion beam etching process, an etching gas mixture may be supplied. Suitable gases supplied in the etching gas mixture include $Cl_2$, $CF_4$, $CH_2F_2$, $NF_3$, HCl, HBr, $SF_6$ or other suitable halogen containing gases. Inert gas such as Ar, He, Kr, Ne and Xe, may also be supplied in the etching gas mixture.

When an inert gas is selected as the etching gas mixture for the etching process, the atoms from the inert gas physically bombard and collide with the atoms made up the film stack 650. The power applied during the ion beam etching process may provide momentum to the atoms from the inert gas. The atoms with momentum collides with the atoms from the film stack 650, thus grinding and etching away the area being interfaced with. In one embodiment, inert gas with high molecular weight, such as Ar, He, Kr, Ne and Xe, may be selected to perform the ion beam etching process. As these elements have relatively high molecular weight, a relatively higher collision power may be obtained when striking the surface of the film stack 650 so as to provide an efficient collision to alter and trim the structure of the film stack 650. Additional gases may also be supplied in the etching gas mixture as needed.

Several process parameters may be controlled during the directional etching process. The inert gas in the second gas mixture may be supplied into the processing chamber at a flow rate between about 10 sccm and about 200 sccm. The chamber pressure is generally maintained between about 0.1 mTorr and about 100 mTorr, such as about 10 mTorr. A RF power, such as capacitive or inductive RF power, DC power, electromagnetic energy, or magnetron sputtering, may be supplied into the processing chamber 200 to assist dissociating the gas mixture during processing. Ions generated by the dissociative energy may be accelerated toward the substrate using an electric field produced by applying a DC or RF electrical bias to the substrate support or to a gas inlet above the substrate support, or both. In some embodiments, the ions may be subjected to a mass selection or mass filtration process, which may comprise passing the ions through a magnetic field aligned orthogonal to the desired direction of motion. The electric field provided by the RF power may be capacitively or inductively coupled for purposes of ionizing the atoms, and may be a DC discharge field or an alternating field, such as an RF field. Alternately, microwave energy may be applied to the ion implanting gas mixture containing any of these elements to generate ions. In some embodiments, the gas containing energetic ions may be a plasma. An electrical bias (peak to peak voltage) of between about 50 V and about 10000 V, such as about 4000V is applied to the substrate support, the gas distributor, or both, to accelerate the ions toward the substrate surface with the desired energy. In some embodiments, the electrical bias is also used to ionize the ion implantation processing gas. In other embodiments, a second electric field is used to ionize the process gas. In one embodiment, a RF field with a frequency of about 2 MHz is provided to ionize the ion implantation processing gas and bias the substrate support at a power level between about 100 W and about 10000 W. The ions thus produced will generally be accelerated toward the substrate by biasing the substrate or a gas distributor as described above.

It is noted that although the profile of the partly formed magnetic tunnel junction (MTJ) structure 655 as formed after patterning the film stack 650 has a vertical sidewall, it is noted that the magnetic tunnel junction (MTJ) structure 655 may have other profiles, such as tapered profiles or any suitable sidewall profiles with desired slopes as needed.

Figure 6D:
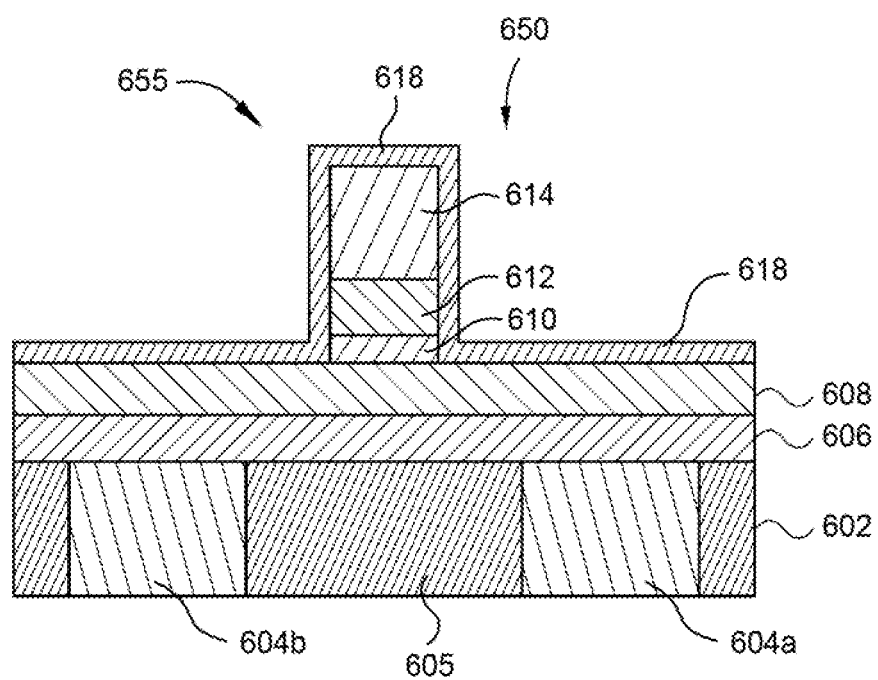

At operation 506, a deposition process is performed to form a spacer layer 618 covering the magnetic tunnel junction (MTJ) structure 655, as shown in FIG. 6D. The spacer layer 618 may be formed in one or more of the processing chambers incorporated in the cluster processing system 400 depicted in FIG. 4. The spacer layer 618 may be formed from any suitable deposition processes, such as ALD, CVD, spin coating, or the like. The spacer layer 618 may be a dielectric layer, such as a SiN, SiOC, SiON, SiOC, $SiO_2$, SiC, amorphous carbon, or other suitable insulating materials as needed. In one example, the spacer layer 618 is a silicon nitride or silicon carbon nitride layer.

The spacer layer 618 is conformally formed on the substrate 602 covering the magnetic tunnel junction (MTJ) structure 655 as well as the exposed free layer 608 or SOT layer 606. The spacer layer 618 has a thickness between about 3 nm and about 30 nm.

Figure 6E:
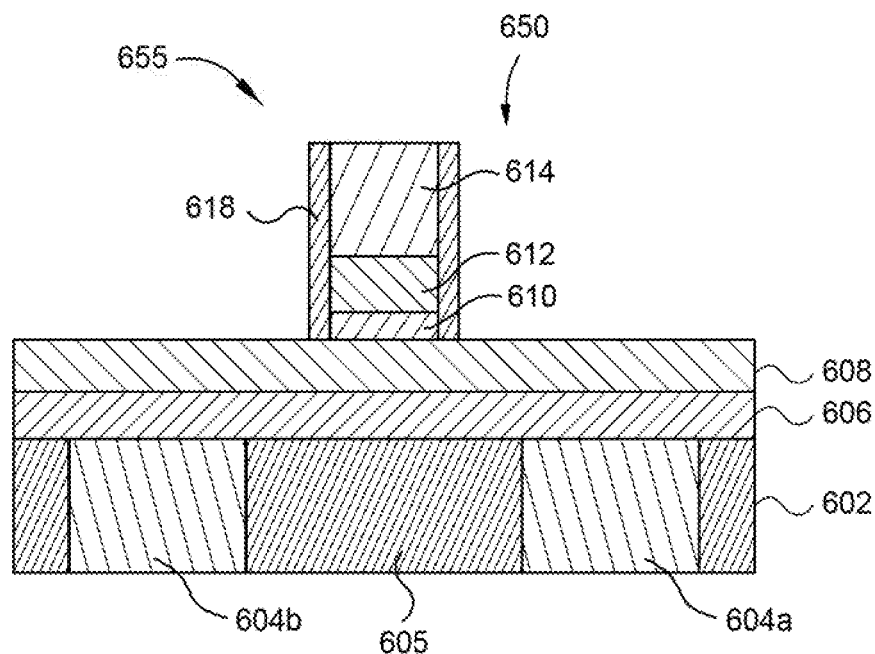

At operation 508, a patterning process is performed to pattern the spacer layer 618, as shown in FIG. 6E. The spacer layer 618 is patterned to remove the spacer layer 618 from a top surface of the hardmask layer 614 and the hardmask layer 614 located on the top surface of the free layer 608 or on the top surface of the SOT layer 606. Thus, after the patterning process at operation 508, the spacer layer 618 is selectively formed on the sidewalls of the magnetic tunnel junction (MTJ) structure 655. The spacer layer 618 may be later formed as a sidewall protection structure when the manufacturing process of the magnetic tunnel junction (MTJ) structure 655 is completed.

Figure 6F:
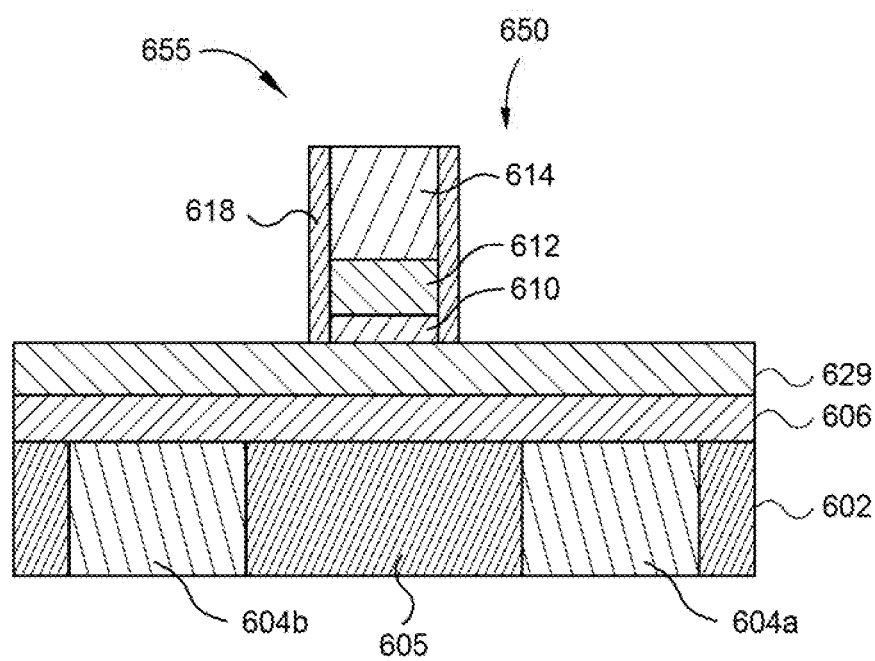

At operation 510, an oxidation process is performed to oxidizing the exposed surface 625 of the free layer 608, forming an oxidized free layer 629, as shown in FIG. 6F. It is noted that in the embodiment wherein the exposed surface after patterning is the SOT layer 606, this oxidation process may be eliminated.

The oxidation layer may be formed by performing an oxidation process by supplying an oxygen containing gas to the surface of the free layer 608 so as to attach the oxygen elements onto the surface of the free layer 606, forming the oxidized free layer 629. The oxidation process may be a radical plasma oxidation process, plasma oxidation process, surface oxidization process, or any suitable oxidation processes. It is noted that the oxidation chambers may be coupled to, or part of, an integrated processing tool, such as the cluster system 400 depicted in FIG. 4. It is contemplated that the methods described herein may be practiced using other processing chamber and cluster tools having suitable process chambers coupled thereto.

Figure 6G:
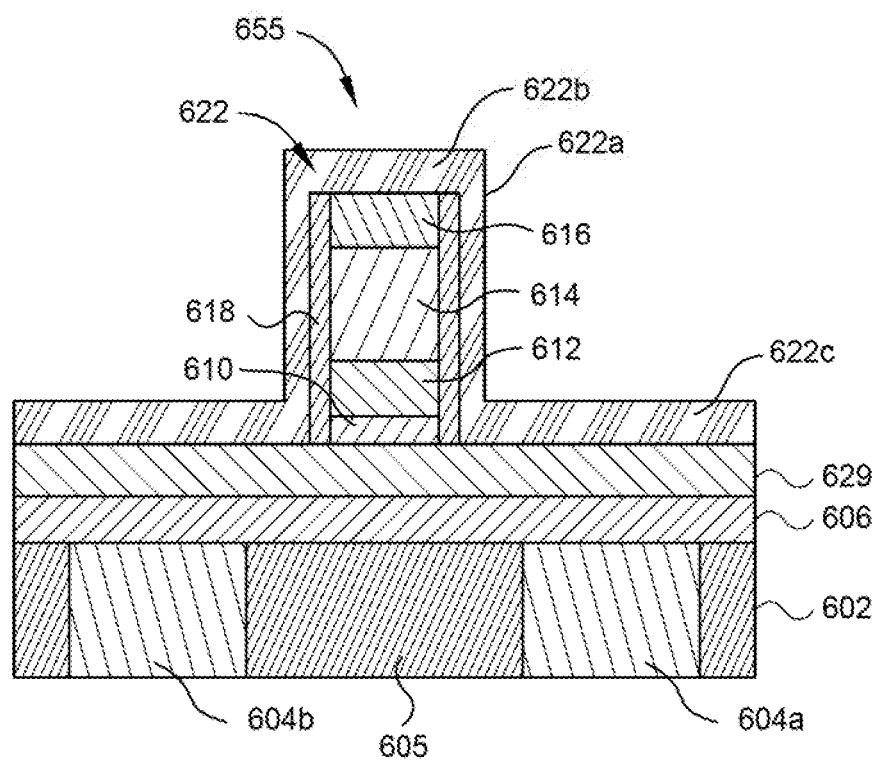

In one example, the oxidation process described herein may be performed in any suitable chamber configured for radical oxidation, also known as in-situ steam generation (ISSG), or the like. Suitable oxidation chambers may include, but are not limited to, RADIANCE®, Plasma Immersion Ion Implantation (P3I), VANTAGE® RADOX™, VANTAGE® RADIANCE® Plus, CENTURA® RADOX™ chambers available from Applied Materials, Inc. of Santa Clara, Calif. Exemplary surface oxidation process, or called radical plasma oxidation process, may be performed with various oxidative chemistries include varying reducing gas concentration for reducing gases, such as one or more of hydrogen ($H_2$), ammonia ($NH_3$) or the like within an oxidative gas mixture include oxidative gases, such as one or more of oxygen ($O_2$), nitric oxide (NO), nitrous oxide ($N_2O$) or the like, and optionally including nonreactive gases, such as one or more of nitrogen gas ($N_2$), helium (He), argon (Ar), neon (Ne), and xenon (Xe). One form of radical plasma At operation 512, after the oxidation process, a deposition process is performed to form a passivation layer 622 on the substrate 602, as shown in FIG. 6G. The passivation layer 622 may have a top portion 622b, a sidewall portion 622a, and a bottom portion 622c. The top portion 622b is formed on the top surface of the hardmask layer 613. The sidewall portion 622a is formed lining against the spacer layer 618 while the bottom portion 622c is formed on the top surface of the oxidized free layer 629, as shown in FIG. 6G.

In one example, the passivation layer 622 is also fabricated from an insulating material the same or different from the spacer layer 618. In one example, the passivation layer 622 may be an insulating material, such as a SiN, SiOC, SiON, SiOC, $SiO_2$, SiC amorphous carbon, or other suitable insulating materials as needed. In one particular example, the passivation layer 622 is a silicon nitride (SiN) layer.

Accordingly, processes and apparatus of forming MTJ device structures for MRAM are provided. In one embodiment, an ion beam etching process is utilized to pattern a film stack for forming the MTJ structure. An end point detector, such as an OES and/or a secondary-ion mass spectrometry (SIMS), is utilized during the patterning process to assist determining an end point for the patterning process so that the likelihood of damaging the underling or nearby layers is minimized. Furthermore, additional passivation layer or spacer layer may be formed around the patterned MTJ device structure as needed.

While the foregoing is directed to embodiments of the disclosure, other and further embodiments of the disclosure may be devised without departing from the basic scope thereof.

What is claimed is:

1. A method for forming a magnetic tunnel junction (MTJ) device structure, comprising:
performing a first patterning process by an ion beam etching process in a processing chamber to pattern a film stack disposed on a substrate, wherein the film stack comprises a reference layer, a tunneling barrier layer and a free layer, wherein the film stack is disposed on a spin-orbit-torque SOT layer; and
determining an end point for the first patterning process before etching the free layer.

2. The method of claim 1, further comprising:
forming a spacer layer covering sidewalls of the patterned film stack wherein the spacer layer stops prior to the SOT layer.

3. The method of claim 2, wherein the spacer layer is a dielectric layer.

4. The method of claim 1, wherein determining the end point further comprising:
receiving a signal from an ion beam generated during the ion beam etching process by an end point detector disposed in the processing chamber.

5. The method of claim 4, wherein the end point detector is an optical emission spectroscopy and/or a secondary-ion mass spectrometry (SIMS).

6. The method of claim 4, wherein the signal comprises an element released from the free layer.

7. The method of claim 2, further comprising:
patterning the spacer layer;
performing an oxidation process on the substrate; and
forming a passivation layer covering the spacer layer.

8. The method of claim 7, wherein the performing the oxidation process further comprises:
oxidizing the free layer exposed on the substrate.

9. The method of claim 2, further comprising:
performing a second patterning process by the ion beam etching process in a processing chamber to pattern the free layer.

10. The method of claim 1, wherein performing the patterning process further comprises:
determining the end point when the free layer is exposed.

11. The method of claim 9, wherein determining the endpoint further comprises:
determining the endpoint when the SOT layer is exposed.

12. The method of claim 11, wherein the determining the endpoint further comprising:
terminating the patterning process when a Mg element is traced when the SOT layer is fabricated from MgO.

13. The method of claim 1, wherein the determining the endpoint further comprising:
terminating the patterning process when a Co, Fe, or B element is traced when the free layer is fabricated from CoFeB containing material.

14. The method of claim 7, wherein the passivation layer is a dielectric layer.

15. A method for forming a magnetic tunnel junction (MTJ) device structure, comprising:
patterning a film stack disposed on a substrate by an ion beam etching process in a processing chamber, wherein the film stack comprises a reference layer, a tunneling barrier layer and a free layer disposed on the tunneling barrier; and
determining an end point by an end point detector of the processing chamber.

16. The method of claim 15, wherein the end point is determined when the free layer is exposed.

17. The method of claim 15, wherein the film stack further comprises a SOT layer disposed on the substrate under the free layer.

18. The method of claim 17, wherein the end point is determined when the SOT layer is exposed.

19. A method for forming a magnetic tunnel junction (MTJ) device structure, comprising:
patterning a film stack disposed on a substrate by an ion beam etching process in a processing chamber, wherein the film stack comprises a reference layer, a tunneling barrier layer and a free layer disposed on the tunneling barrier;
determining an end point by an optical emission spectroscopy in the processing chamber; and
forming a passivation layer on the patterned film stack.

* * * * *